(12) United States Patent
Jung et al.

(10) Patent No.: US 12,446,461 B2
(45) Date of Patent: Oct. 14, 2025

(54) ORGANIC COMPOUND, ORGANIC LIGHT-EMITTING DIODE INCLUDING ORGANIC COMPOUND, AND DISPLAY DEVICE INCLUDING ORGANIC LIGHT-EMITTING DIODE

(71) Applicant: SOULBRAIN CO., LTD., Gyeonggi-do (KR)

(72) Inventors: Kwang Ju Jung, Gyeonggi-do (KR); Jong Jin Ha, Gyeonggi-do (KR); Seok Jong Lee, Gyeonggi-do (KR); Hyun Young Yoo, Gyeonggi-do (KR); Eun Chul Shin, Gyeonggi-do (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 839 days.

(21) Appl. No.: 17/773,307

(22) PCT Filed: Oct. 30, 2020

(86) PCT No.: PCT/KR2020/015100
§ 371 (c)(1),
(2) Date: Apr. 29, 2022

(87) PCT Pub. No.: WO2021/086142
PCT Pub. Date: May 6, 2021

(65) Prior Publication Data
US 2022/0407011 A1    Dec. 22, 2022

(30) Foreign Application Priority Data

Oct. 31, 2019   (KR) .................. 10-2019-0138125
Oct. 30, 2020   (KR) .................. 10-2020-0143885

(51) Int. Cl.
| | | |
|---|---|---|
| H01L 51/54 | (2006.01) | |
| C07D 403/10 | (2006.01) | |
| H10K 85/60 | (2023.01) | |
| H10K 50/16 | (2023.01) | |

(52) U.S. Cl.
CPC ......... *H10K 85/654* (2023.02); *C07D 403/10* (2013.01); *H10K 85/615* (2023.02); *H10K 85/6572* (2023.02); *H10K 50/16* (2023.02)

(58) Field of Classification Search
CPC .. C07D 403/10; H10K 85/654; H10K 85/615; H10K 85/6572; H10K 50/16
See application file for complete search history.

(56) References Cited

U.S. PATENT DOCUMENTS

| | | |
|---|---|---|
| 2014/0209874 A1 | 7/2014 | Chun et al. |
| 2017/0317293 A1 | 11/2017 | Kim et al. |
| 2019/0027698 A1 | 1/2019 | Bae et al. |
| 2019/0319197 A1 | 10/2019 | Pan et al. |

FOREIGN PATENT DOCUMENTS

| | | |
|---|---|---|
| CN | 106573911 A | 4/2017 |
| CN | 107112427 A | 8/2017 |
| CN | 107586290 A | 1/2018 |
| CN | 108623430 A | 10/2018 |
| CN | 109748880 A | 5/2019 |
| CN | 110229145 A | 9/2019 |
| JP | 2017535071 A | 11/2017 |
| JP | 2019528562 A | 10/2019 |
| KR | 10-2014-0097934 A | 8/2014 |
| KR | 20140097934 A | 8/2014 |
| KR | 10-2015-0100493 A | 9/2015 |
| KR | 10-2017-0016936 A | 2/2017 |
| KR | 10-2017-0075645 A | 7/2017 |
| KR | 10-2017-0086555 A | 7/2017 |
| KR | 20170075645 A | 7/2017 |
| KR | 20170086555 A | 7/2017 |
| KR | 10-2017-0116944 A | 10/2017 |
| KR | 10-2019-0033901 A | 4/2019 |
| KR | 20190033901 A | 4/2019 |
| KR | 20200091778 A | 7/2020 |
| WO | 2013077352 A1 | 5/2013 |
| WO | 2015072520 A1 | 5/2015 |
| WO | 2015190400 A1 | 12/2015 |
| WO | 2016076384 A1 | 5/2016 |
| WO | 2016080622 A1 | 5/2016 |
| WO | 2016175211 A1 | 11/2016 |
| WO | 2019004599 A1 | 1/2019 |
| WO | 2019098234 A1 | 5/2019 |

*Primary Examiner* — Andrew K Bohaty
(74) *Attorney, Agent, or Firm* — SZDC Law PC

(57) ABSTRACT

The present invention relates to an organic compound, an organic light-emitting diode including the organic compound, and a display device including the organic light-emitting diode. More particularly, the present invention relates to an organic compound including a compound presented by Chemical Formula 1 and being capable of improving luminous efficacy, thermal stability, and lifespan properties, an organic light-emitting diode including the organic compound, and a display device including the organic light-emitting diode.

7 Claims, No Drawings

ORGANIC COMPOUND, ORGANIC LIGHT-EMITTING DIODE INCLUDING ORGANIC COMPOUND, AND DISPLAY DEVICE INCLUDING ORGANIC LIGHT-EMITTING DIODE

This application is the National Stage Application of PCT/KR2020/015100, filed on Oct. 30, 2020, which claims priority to Korean Patent Application Nos. KR 10-2019-0138125, filed on Oct. 31, 2019 and KR 10-2020-0143885, filed on Oct. 30, 2020, all of which are incorporated by reference for all purposes as if fully set forth herein.

TECHNICAL FIELD

The present invention relates to an organic compound, an organic light-emitting diode including the organic compound, and a display device including the organic light-emitting diode. More particularly, the present invention relates to an organic compound capable of improving luminous efficacy, thermal stability, and lifespan properties, an organic light-emitting diode including the organic compound, and a display device including the organic light-emitting diode.

Background Art

An organic light-emitting diode (OLED) is a self-emissive device. In addition to a wide viewing angle and excellent contrast, the organic light-emitting diode has advantages such as fast response time and excellent luminance, driving voltage, and response speed, and may be implemented in various colors.

A general organic light-emitting diode has a structure in which an organic material layer is inserted between an anode and a cathode, and the organic material layer may have a multilayer structure including a hole injection layer, a hole transport layer, a light-emitting layer, an electron transport layer, an electron injection layer, and the like.

When a voltage is applied between the two electrodes of the organic light-emitting diode, holes are injected into the organic material layer from the anode, and electrons are injected into the organic material layer from the cathode.

At this time, high-energy excitons are formed in the process of recombination of the injected holes and electrons. At this time, as the formed excitons move back to a ground state, light having a specific wavelength is generated.

Meanwhile, to increase the luminous efficacy, stability, and lifespan of the organic light-emitting diode, a hole injection material, a hole transport material, a light-emitting material, an electron transport material, an electron injection material, and the like constituting the organic material layer should be stable and efficient. However, development of the organic layer materials is still insufficient.

Accordingly, development of novel materials is continuously required, and development of electron transport materials is urgently needed.

RELATED ART DOCUMENTS

Patent Documents

KR 2015-0100493 A

Disclosure

Technical Problem

Therefore, the present invention has been made in view of the above problems, and it is one object of the present invention to provide an organic compound capable of improving luminous efficacy, thermal stability, and lifespan properties.

It is another object of the present invention to provide an organic light-emitting diode having excellent luminous efficacy, thermal stability, and lifespan properties by including the organic compound of the present invention and a display device including the organic light-emitting diode.

The above and other objects can be accomplished by the present invention described below.

Technical Solution

In accordance with one aspect of the present invention, provided is an organic compound represented by Chemical Formula 1 below:

[Chemical Formula 1]

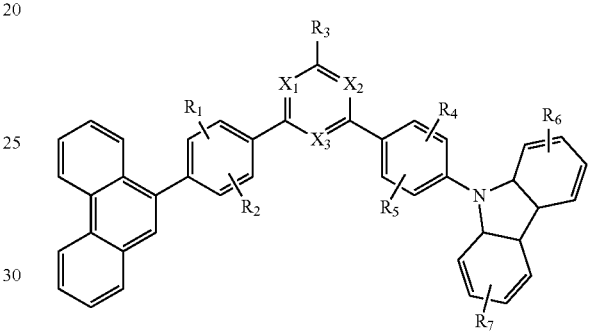

wherein $X_1$ to $X_3$ are independently nitrogen (N) or carbon (C), and $R_1$ to $R_7$ are independently selected from the group consisting of hydrogen, a substituted or unsubstituted aryl group having 6 to 20 carbon atoms, and a substituted or unsubstituted heteroaryl group having 5 to 20 carbon atoms.

In accordance with another aspect of the present invention, provided is an electron transport material including the organic compound of the present invention and an organic light-emitting diode including the organic compound of the present invention.

In accordance with yet another aspect of the present invention, provided is a display device including the organic light-emitting diode of the present invention.

Advantageous Effects

According to the present invention, the present invention has an effect of proving an organic compound capable of improving luminous efficacy, thermal stability, and lifespan properties, an organic light-emitting diode including the organic compound, and a display device including the organic light-emitting diode.

Best Mode

Hereinafter, an organic compound, an organic light-emitting diode including the organic compound, and a display device including the organic light-emitting diode according to the present invention will be described in detail.

In the present disclosure, unless otherwise defined, "substitution" means that at least one hydrogen in an atomic group in a compound or molecule is substituted with a halogen group, a hydroxyl group, an amino group, a fluorenyl group, a C1 to C30 amine group, a nitro group, a C1 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group, a C1 to C10 trifluoroalkyl group such as a trifluoromethyl group, or a cyano group. In this case, the C1 to C30 amine group and the C1 to C40 silyl group may be substituted with one or more substituents selected from hydrogen, a halogen group, an alkyl group, and an aryl group.

In the present disclosure, unless otherwise defined, "hetero" means that one functional group contains 1 to 3 heteroatoms selected from the group consisting of N, O, S, and P, and the remainder is carbon.

In the present disclosure, "*-" means a moiety connected to a carbon atom or an atom other than carbon, that is, a moiety to which a substituent or a functional group is connected.

In the present disclosure, unless otherwise defined, "alkyl group" means a saturated aliphatic hydrocarbon group.

In the present disclosure, "aryl group" means a substituent in which all elements of a cyclic substituent have p-orbitals and these p-orbitals form a conjugate, and includes monocyclic or fused ring polycyclic (i.e., rings that share adjacent pairs of carbon atoms) functional groups.

In the present disclosure, "heteroaryl group" means that an aryl group contains 1 to 3 heteroatoms selected from the group consisting of N, O, S, and P, and the remainder is carbon. When the heteroaryl group is a fused ring, each ring may include 1 to 3 heteroatoms.

In the present disclosure, unless otherwise defined, the term "electron transport material" refers to an organic material responsible for injection and transport of electrons necessary for light emission, such as electrons and holes, among components constituting an organic light-emitting diode.

The present inventors confirmed that, when various synthesized compounds were used in an organic material layer, particularly an electron transport layer, an organic light-emitting diode having high luminous efficacy even at a low driving voltage and excellent thermal stability and lifespan properties was obtained. Based on these results, the present inventors conducted further studies to complete the present invention.

The organic compound of the present invention is represented by Chemical Formula 1 below. In this case, the luminous efficacy, thermal stability, and lifespan properties of an organic light-emitting diode may be improved.

[Chemical Formula 1]

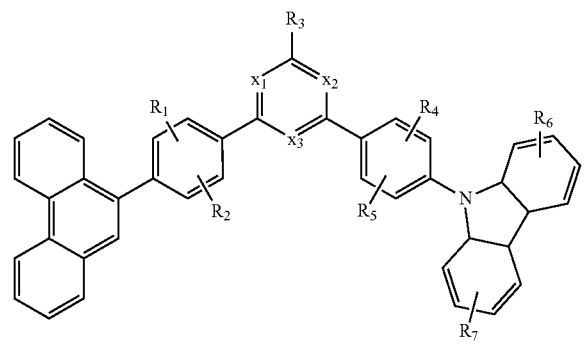

In Chemical Formula 1, $X_1$ to $X_3$ are independently nitrogen (N) or carbon (C), and $R_1$ to $R_7$ are independently selected from the group consisting of hydrogen, a substituted or unsubstituted aryl group having 6 to 20 carbon atoms, and a substituted or unsubstituted heteroaryl group having 5 to 20 carbon atoms.

In Chemical Formulas of the present invention, a hydrogen atom bonded to carbon is omitted.

In Chemical Formula 1, for example, $X_1$ to $X_3$ may independently be nitrogen (N) or carbon (C). Preferably, at least two of $X_1$ to $X_3$ is N. In this case, due to excellent electron transport performance, luminous efficacy may be improved.

In Chemical Formula 1, for example, $R_1$ to $R_7$ may independently be selected from the group consisting of hydrogen, a substituted or unsubstituted aryl group having 6 to 20 carbon atoms, and a substituted or unsubstituted heteroaryl group having 5 to 20 carbon atoms. In this case, electron transport performance may be improved, and excellent luminous efficacy and lifespan properties may be obtained.

In the present disclosure, "substituted or unsubstituted" means unsubstituted or substituted with one or more substituents of hydrogen, a halogen group, an alkyl group, and an aryl group.

As a specific example, $R_1$ to $R_7$ may independently be selected from the group consisting of hydrogen, a phenyl group, a biphenyl group, a terphenyl group, a naphthyl group, an anthracenyl group, a phenanthrene group, a pyrenyl group, a perylenyl group, a chrysenyl group, a carbazole group, a thiophene group, a furan group, a pyrrole group, an imidazole group, a triazole group, an oxazole group, an oxadiazole group, a triazole group, a pyridyl group, a pyradazine group, a quinolinyl group, an isoquinoline group, and an acridyl group. In this case, high luminous efficacy may be achieved even at a low driving voltage, and lifespan properties may be improved.

For example, both $R_1$ and $R_2$ may be hydrogen. In this case, luminous efficacy, thermal stability, and lifespan properties may be improved.

As another example, both $R_1$ and $R_2$ may be a phenyl group. In this case, high luminous efficacy may be achieved even at a low driving voltage.

As another example, $R_1$ and $R_2$ are independently hydrogen or a phenyl group, and $R_1$ and $R_2$ are different. In this case, electron transport performance may be improved, and luminous efficacy and lifespan properties may be excellent.

As a specific example, $R_3$ may be represented by one of Chemical Formulas 2-1 to 2-6 below, preferably one of Chemical Formulas 2-1 to 2-4. In this case, by having a glass transition temperature and a decomposition temperature, thermal stability may be excellent, and thus driving stability may be improved.

[Chemical Formula 2-1]

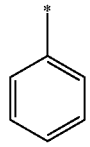

[Chemical Formula 2-2]

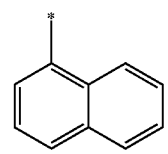

[Chemical Formula 2-3]

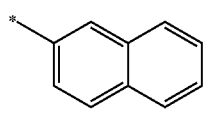

[Chemical Formula 2-4]

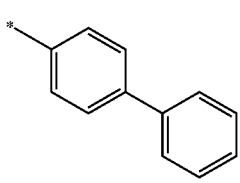

[Chemical Formula 2-5]

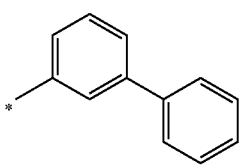

[Chemical Formula 2-6]

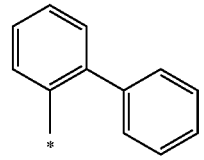

For example, both $R_4$ and $R_5$ may be hydrogen. In this case, due to excellent electron transport performance, luminous efficacy may be improved.

As another example, both $R_4$ and $R_5$ may be a phenyl group. In this case, electron transport performance may be improved, and luminous efficacy and lifespan properties may be excellent.

As another example, $R_4$ and $R_5$ are independently hydrogen or a phenyl group, and $R_4$ and $R_5$ are different. In this case, high luminous efficacy may be achieved even at a low driving voltage, and lifespan properties may be improved.

For example, both $R_6$ and $R_7$ may be hydrogen. In this case, electron transport performance may be excellent.

As another example, $R_6$ and $R_7$ are independently hydrogen or a phenyl group, and $R_6$ and $R_7$ are different. In this case, high luminous efficacy may be achieved even at a low driving voltage, and thermal stability and lifespan properties may be improved.

For example, Chemical Formula 1 may be one of Chemical Formulas 1-1 to 1-13. In this case, high luminous efficacy may be achieved even at a low driving voltage, and lifespan properties may be improved.

[Chemical Formula 1-1]

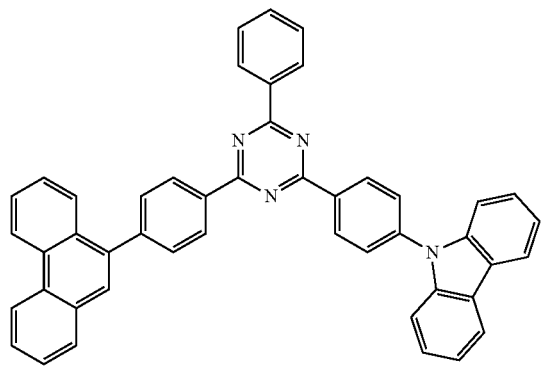 [SMILES: c1ccc(-c2nc(-c3ccc(-c4cc5ccccc5c5ccccc45)cc3)nc(-c3ccc(-n4c5ccccc5c5ccccc54)cc3)n2)cc1]

[Chemical Formula 1-2]

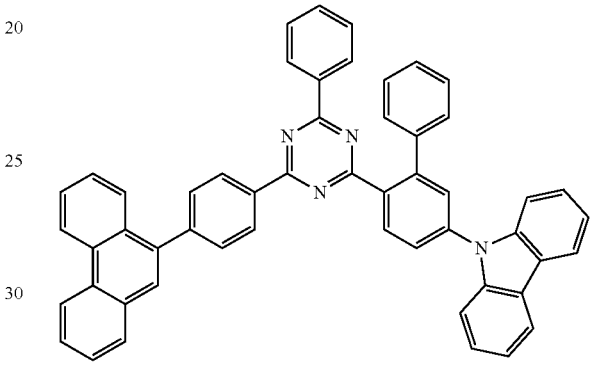

[Chemical Formula 1-3]

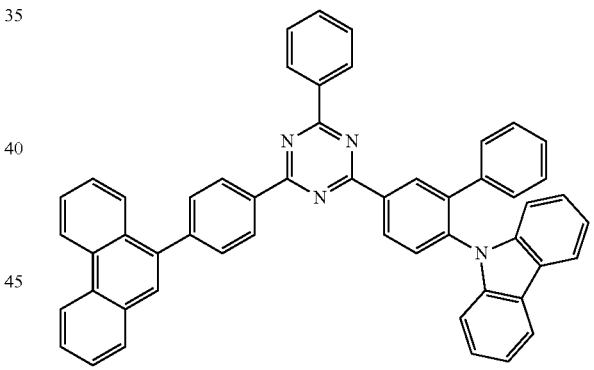

[Chemical Formula 1-4]

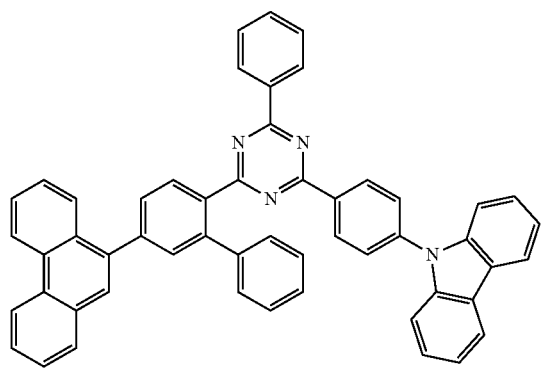

[Chemical Formula 1-5]
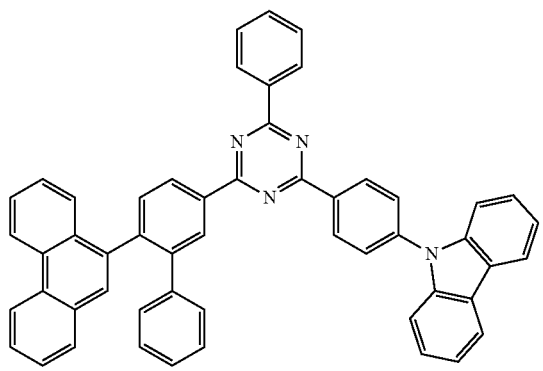
[Chemical Formula 1-6]
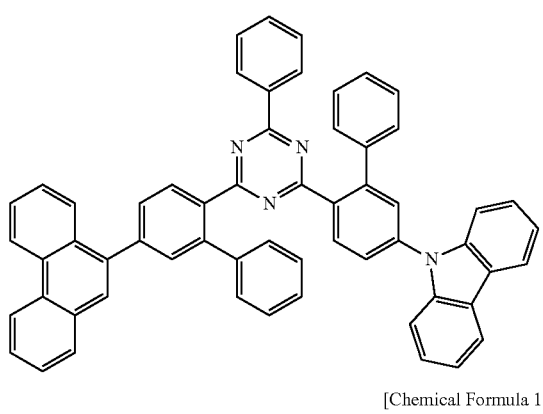
[Chemical Formula 1-7]
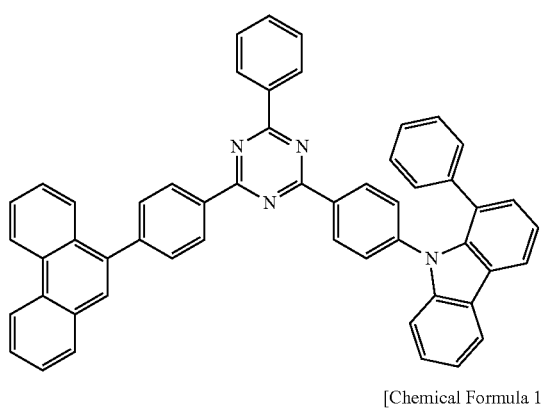
[Chemical Formula 1-8]
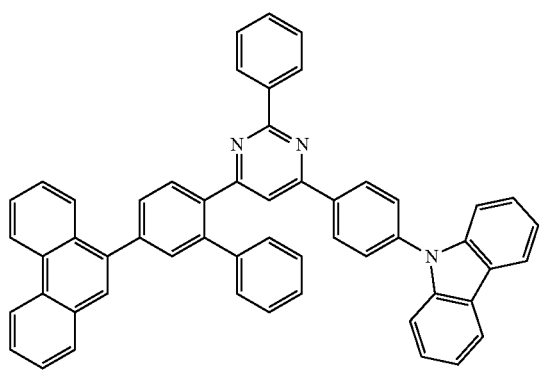
[Chemical Formula 1-9]
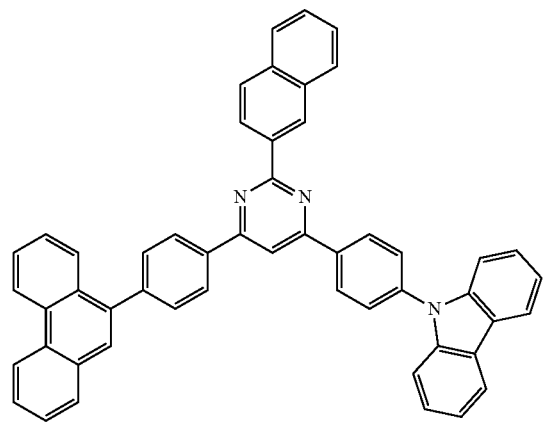
[Chemical Formula 1-10]
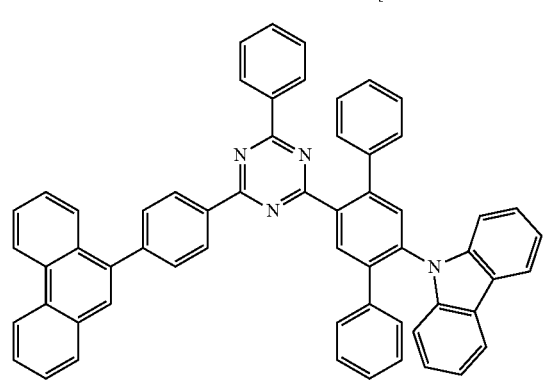
[Chemical Formula 1-11]
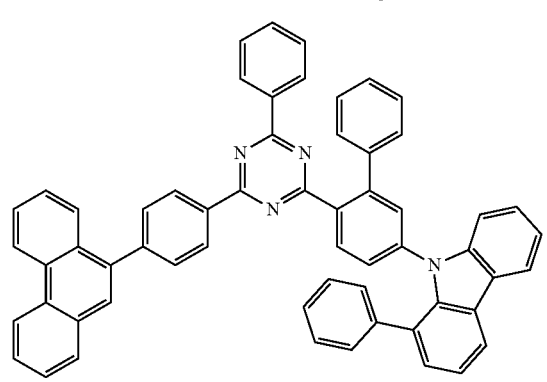
[Chemical Formula 1-12]
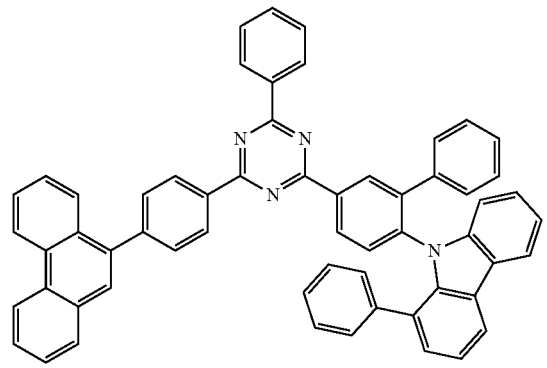

-continued

[Chemical Formula 1-13]

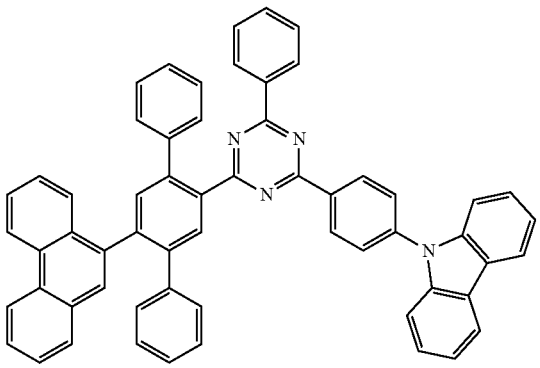

For example, the organic light-emitting diode of the present invention may include a first electrode; a second electrode; and an organic material layer disposed between the first and second electrodes.

For example, the organic material layer may include one or more selected from the group consisting of an electron injection layer, an electron transport layer, a light-emitting layer, a hole transport layer, and a hole injection layer. In the organic material layer, one or more layers may include the organic compound of the present invention. In this case, when a forward bias is applied, holes flow into the light-emitting layer from the first electrode, electrons flow into the light-emitting layer from the second electrode, and the injected electrons and holes combine to form excitons. At this time, as the excitons transition to a ground state, light is emitted. In this case, a wide viewing angle and a fast response time may be obtained, and luminance, driving voltage, and response speed characteristics may be excellent.

The organic compound may be used as any one material selected from the group consisting of an electron transport material, a hole transport material, and a host material of a light-emitting layer.

For example, the electron transport layer may include an electron transport material, and the electron transport material may include the organic compound of the present invention. In this case, due to improvement in electron transport performance, luminous efficacy may be excellent.

When the organic compound is used as an electron transport material, excellent electron transport properties may be obtained without substantial increase in a driving voltage. In this case, the luminous efficacy, thermal stability, and lifespan of the organic light-emitting diode may be improved.

Hereinafter, the organic light-emitting diode will be described in detail. However, the organic light-emitting diode of the present invention is not limited by the following examples.

For example, the organic light-emitting diode may have a structure in which a first electrode; a hole injection layer; a hole transport layer; a light-emitting layer; an electron transport layer (ETL); an electron injection layer; and a second electrode are sequentially laminated. Specifically, an electron blocking layer (EBL) may be further included between the first electrode and the light-emitting layer, and a hole blocking layer (HBL) may be further included between the second electrode and the light-emitting layer.

For example, the first electrode may be an anode, and the second electrode may be a cathode. In this case, holes are injected into the light-emitting layer from the anode, electrons are injected into the light-emitting layer from the cathode, and the holes and the electrons combine in the light-emitting layer to generate excitons. In this case, red, green, and blue emission colors may be effectively implemented.

For example, the anode may include one or more selected from the group consisting of a conductive metal oxide, a metal, and carbon.

For example, the conductive metal oxide may include one or more selected from the group consisting of indium tin oxide (ITO), fluorine tin oxide (FTO), aluminum zinc oxide (AZO), gallium zinc oxide (GZO), antimony tin oxide (ATO), indium zinc oxide (IZO), zinc oxide (Zno), and oxide/metal/oxide (OMO). In this case, transparency may be excellent.

For example, metals commonly used in the art may be used as the metal of the present invention without particular limitation.

For example, the carbon may include one or more selected from the group consisting of graphite, graphene, and carbon nanotubes.

For example, a cathode commonly used in the art may be used as the cathode of the present invention without particular limitation. The cathode of the present invention may include one or more selected from the group consisting of aluminum, magnesium, calcium, sodium, potassium, indium, lithium, silver, lead and cesium.

For example, the hole injection layer may include a hole injection material. The hole injection material may include, for example, one or more selected from the group consisting of copper phthalocyanine (CuPc), 4,4',4"-tris(3-methylphenylamino)triphenylamine (m-MTDATA), 4,4',4"-tris(3-methylphenyl amino)phenoxybenzene (m-MTDAPB), 4,4',4"-tri(N-carbazolyl)triphenylamine (TCTA), which is a starburst-type amine, and 4,4',4"-tris(N-(2-naphthyl)-N-phenylamino)-triphenylamine (2-TNATA). In this case, holes may be efficiently injected from the anode into the light-emitting layer.

For example, the hole injection layer may have a thickness of 100 to 10,000 Å or 100 to 5,000 Å, preferably 100 to 1,000 Å. Within this range, hole injection properties may be improved without increase in a driving voltage.

In the present disclosure, unless otherwise defined, thickness may be measured using Ellipsometer equipment.

For example, the hole transport layer may include a hole transport material. The hole transport material may include, for example, one or more selected from the group consisting of bis(N-(1-naphthyl-n-phenyl))benzidine (α-NPD), N'-di(naphthalene-1-yl)-N,N'-biphenyl-benzidine (NPB), and N,N'-biphenyl-N,N'-bis(3-methylphenly)-1,1'-biphenyl-4,4'-diamine (TPD). In this case, holes may be efficiently transported from the anode to the light-emitting layer.

For example, the hole transport layer may have a thickness of 100 to 10,000 Å or 100 to 5,500 Å, preferably 100 to 3,000 Å. Within this range, hole transport properties may be improved without increase in a driving voltage.

For example, the light-emitting layer may include a luminescent material. The luminescent material may include, for example, one or more selected from the group consisting of tris(8-hydroxyquinolinolato)aluminum (Alq3), Balq(8-hydroxyquinoline beryllium salt), 4,4'-bis(2,2-biphenylethenyl)-1,1'-biphenyl (DPVBi), spiro substances, spiro-4,4'-bis(2,2-biphenylethenyl)-1,1'-biphenyl (spiro-DPVBi), 2-(2-benzooxazolyl)-phenol lithium salt (LiPBO), bis(biphenylvinyl)benzene, aluminum-quinoline metal complexes, imidazole, thiazole, and oxazole, without being limited thereto.

For example, the light-emitting layer may have a thickness of 100 to 1,000 Å, 100 to 700 Å, or 100 to 300 Å. Within this range, light emitting properties may be excellent without substantial increase in a driving voltage.

For example, the electron transport layer may include an electron transport material, and the electron transport material is preferably a compound represented by Chemical Formula 1. In this case, the luminous efficacy, stability, and lifespan properties of an organic light-emitting diode may be improved.

For example, the electron transport layer may have a thickness of 100 to 1,000 Å or 100 to 500 Å, preferably 100 to 300 Å. Within this range, electron transport properties may be improved without substantial increase in a driving voltage.

For example, the electron injection layer may include an electron injection material, and electron injection materials commonly used in the art may be used as the electron injection material of the present invention without particular limitation. For example, the electron injection material may include one or more selected from the group consisting of LiF, NaCl, CsF, $Li_2O$, BaO, $BaF_2$, and lithium quinolate (Liq). In this case, electrons may be efficiently injected from a cathode into a light-emitting layer.

For example, the electron injection layer may have a thickness of 1 to 500 Å or 3 to 300 Å, preferably 5 to 100 Å. Within this range, electron injection properties may be improved without increase in a driving voltage.

The organic light-emitting diode according to the present invention may be manufactured in the order described above, i.e., in the order of a first electrode/a hole injection layer/a hole transport layer/a light-emitting layer/a hole blocking layer/an electron transport layer/an electron injection layer/a second electrode. Alternatively, the organic light-emitting diode may be manufactured in the reverse order, i.e., in the order of a second electrode/an electron injection layer/an electron transport layer/a hole blocking layer/a light-emitting layer/a hole transport layer/a hole injection layer/a first electrode. For example, in a method of manufacturing the organic light-emitting diode, an anode is formed by coating the surface of a substrate with an anode material using a conventional method. For example, as the substrate, a glass or plastic substrate having excellent transparency, surface smoothness, easy handling, and water resistance is preferably used.

A hole injection layer is formed by coating the surface of the anode formed on the substrate with a hole injection material by vacuum thermal deposition or spin coating.

When a hole injection layer is formed by vacuum thermal deposition, deposition conditions may vary depending on a hole injection material and the structure and characteristics of the hole injection layer. For example, a deposition temperature of 100 to 400° C., a degree of vacuum of $10^{-8}$ to about $10^{-6}$ torr, and a deposition rate of 0.01 to 2 Å/sec may be used, without being limited thereto.

When a hole injection layer is formed by spin coating, coating conditions may vary depending on a hole injection material and the structure and characteristics of the hole injection layer. For example, coating may be performed at a coating rate of 2,000 to 5,000 rpm, and heat treatment may be performed at a temperature of 80 to 200° C. to remove a solvent after coating, without being limited thereto.

Next, a hole transport layer is formed by coating the surface of the hole injection layer with a hole transport material by vacuum thermal deposition or spin coating, and a light-emitting layer is formed by coating the surface of the hole transport layer with a luminescent material by vacuum thermal deposition or spin coating.

An electron transport layer may be formed by coating the surface of the light-emitting layer with an electron transport material by vacuum thermal deposition or spin coating. At this time, when the organic compound of the present invention is used as the electron transport material, the luminous efficacy, stability, and lifespan properties of an organic light-emitting diode may be improved.

Next, an electron injection material is formed on the surface of the electron transport layer by a conventional method, and then a cathode is formed by coating the surface of the electron injection layer with a cathode material by vacuum thermal deposition.

For example, a display device of the present invention may include the organic light-emitting diode of the present invention. For example, the display device may be a mobile device (portable computer, electronic notebook, watch, remote control, camcorder), a road sign, a display part of an electronic device, or a wall-mounted TV. In this case, desired effects may be realized.

It is specified that all the above-described configurations for carrying out the present invention can be arbitrarily combined and substituted within the broad framework of the means for solving the problems of the present invention.

Hereinafter, the present invention will be described in more detail with reference to the following preferred examples. However, these examples are provided for illustrative purposes only and should not be construed as limiting the scope and spirit of the present invention. In addition, it will be apparent to those skilled in the art that various changes and modifications may be made without departing from the spirit and scope of the present invention, and such changes and modifications are also within the scope of the appended claims.

EXAMPLES

Preparation Example 1

1) Preparation of Compound 1-1

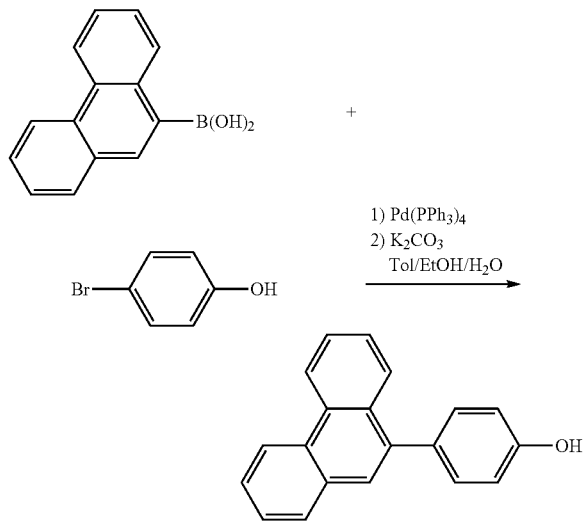

100 g (450.03 mmol, 1 eq) of phenanthren-9-ylboronic acid, 78 g (450.03 mmol, 1 eq) of 4-bromophenol, 26 g (22.54 mmol, 0.05 eq) of Pd(PPh₃)₄, and 187 g (1,352 mmol, 3 eq) of K₂CO₃ were added to a 5 L round flask, and toluene, ethanol (Et-OH), and H₂O were added thereto in an amount of 2.2 L, 450 mL, and 450 mL, respectively, followed by reflux stirring. After reaction, extraction was performed using CH₂Cl₂/H₂O, and a CH₂Cl₂ layer was dried using MgSO₄. Then, purification was performed using a silica-gel column to obtain 103 g of Compound 1-1 in a yield of 85%.

2) Preparation of Compound 1-2

100 g (359.91 mmol, 1 eq) of 4-phenanthren-9-yl-phenol, 74.8 g (739.83 mmol, 2 eq) of triethyl amine, and 1.8 L of methylene chloride (MC) were added to a 5 L round flask and stirred at 0° C. Then, 125 g (443.90 mmol, 1.2 eq) of trifluoromethane sulfuric anhydride was added dropwise thereto, followed by stirring for 1 hour. After reaction, extraction was performed using CH₂Cl₂/H₂O, and a CH₂Cl₂ layer was dried using MgSO₄. Then, purification was performed using a silica-gel column to obtain 119 g of Compound 1-2 in a yield of 80%.

3) Preparation of Compound 1-3

100 g (248 mmol, 1 eq) of 4-(phenanthren-9-yl)phenyl trifluoromethanesulfonate, 126 g (497.03 mmol, 2 eq) of 4,4,4',4',5,5,5',5'-octamethyl-2,2'-bi(1,3,2-dioxaborolane), 14.3 g (24.85 mmol, 0.1 eq) of Pd(dba)₂, 13.9 g (49.70 mmol, 0.2 eq) of Pcy3, 97.5 g (994.06 mmol, 4 eq) of potassium acetate, and 1.2 L of 1,4-dioxane were added to a 3 L round flask, followed by reflux stirring. After reaction, extraction was performed using CH₂Cl₂/H₂O, and a CH₂Cl₂ layer was dried using MgSO₄. Then, purification was performed using a silica-gel column to obtain 56 g of Compound 1-3 in a yield of 90%.

4) Preparation of Compound 1-4

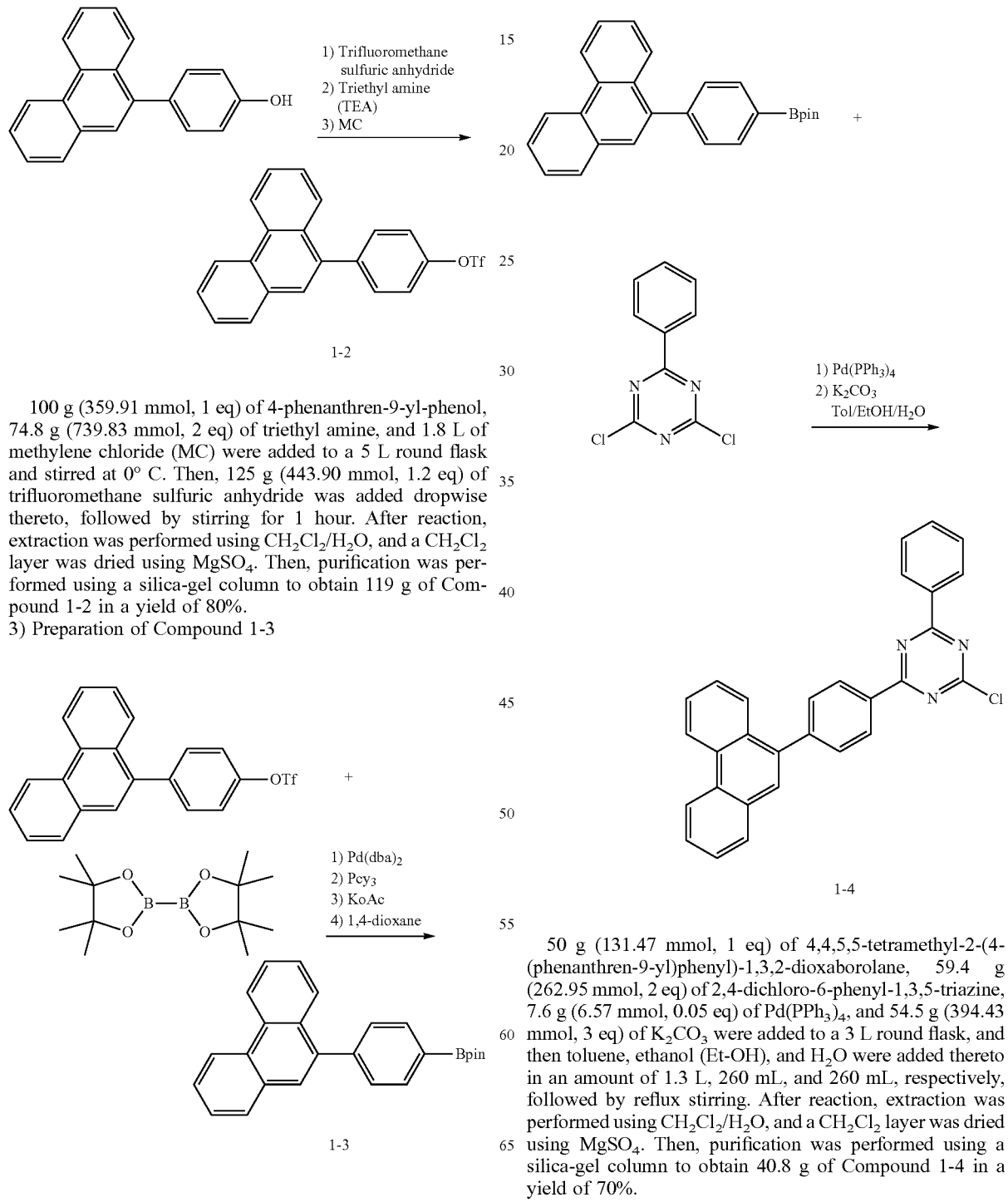

50 g (131.47 mmol, 1 eq) of 4,4,5,5-tetramethyl-2-(4-(phenanthren-9-yl)phenyl)-1,3,2-dioxaborolane, 59.4 g (262.95 mmol, 2 eq) of 2,4-dichloro-6-phenyl-1,3,5-triazine, 7.6 g (6.57 mmol, 0.05 eq) of Pd(PPh₃)₄, and 54.5 g (394.43 mmol, 3 eq) of K₂CO₃ were added to a 3 L round flask, and then toluene, ethanol (Et-OH), and H₂O were added thereto in an amount of 1.3 L, 260 mL, and 260 mL, respectively, followed by reflux stirring. After reaction, extraction was performed using CH₂Cl₂/H₂O, and a CH₂Cl₂ layer was dried using MgSO₄. Then, purification was performed using a silica-gel column to obtain 40.8 g of Compound 1-4 in a yield of 70%.

5) Preparation of Desired Compounds

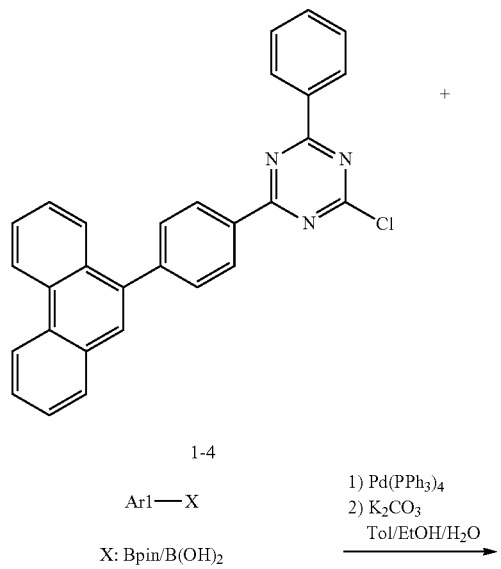

1-4

Ar1—X

X: Bpin/B(OH)₂

1) Pd(PPh₃)₄
2) K₂CO₃
Tol/EtOH/H₂O
→

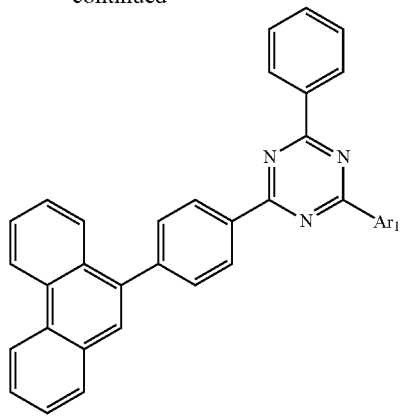

Compound 1-4 (1 eq), Ar1-X (1 eq) shown in Table 1 below, Pd (PPh₃)₄ (0.05 eq), and K₂CO₃ (3 eq) were added to a 500 mL round flask, and then toluene, Et-OH, and H₂O were added thereto, followed by reflux stirring. After reaction, extraction was performed using CH₂Cl₂/H₂O, and a CH₂Cl₂ layer was dried using MgSO₄. Then, purification was performed using a silica-gel column to obtain desired compounds having structures shown in Table 1 below.

TABLE 1

| Formula | Ar1-X | Yield (%) | Desired compounds |
|---|---|---|---|
| 1-1 | ![B(OH)₂-phenyl-carbazole] | 75 | ![compound 1-1] |
| 1-2 | ![Bpin-biphenyl-carbazole] | 71 | ![compound 1-2] |

TABLE 1-continued
| Formula | Ar1-X | Yield (%) | Desired compounds |
|---|---|---|---|
| 1-3 | 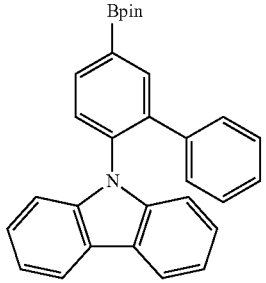 | 70 | 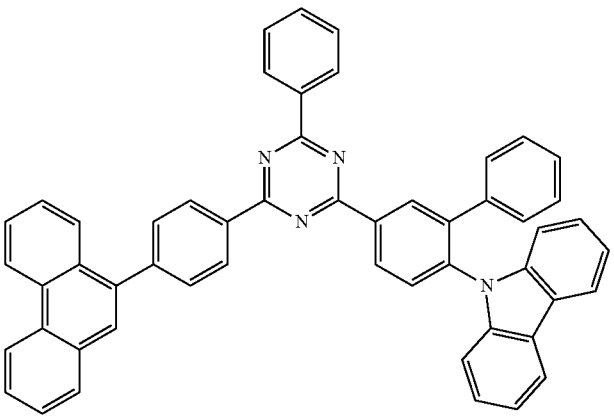 [SMILES: c1ccc(-c2nc(-c3ccc(-c4cc5ccccc5c5ccccc45)cc3)nc(-c3ccc(-n4c5ccccc5c5ccccc54)c(-c4ccccc4)c3)n2)cc1] |
| 1-7 | 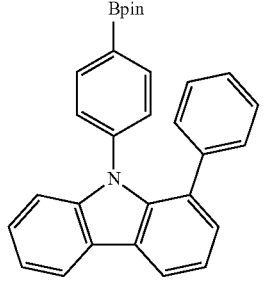 | 65 | 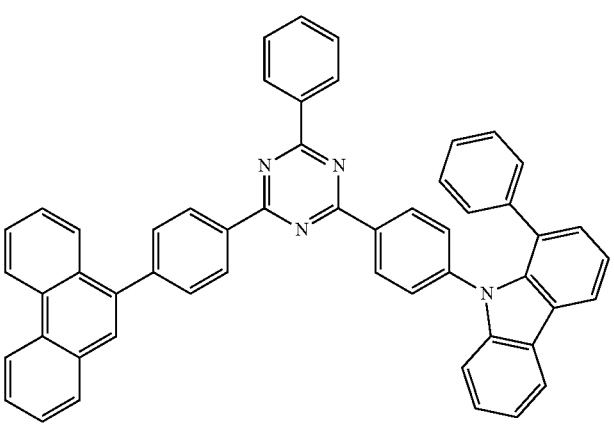 [SMILES: c1ccc(-c2nc(-c3ccc(-c4cc5ccccc5c5ccccc45)cc3)nc(-c3ccc(-n4c5ccccc5c5cccc(-c6ccccc6)c54)cc3)n2)cc1] |
| 1-10 | 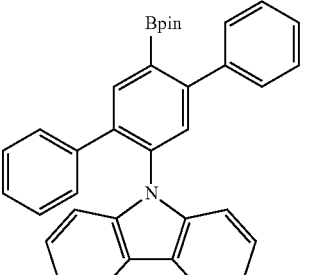 | 67 | 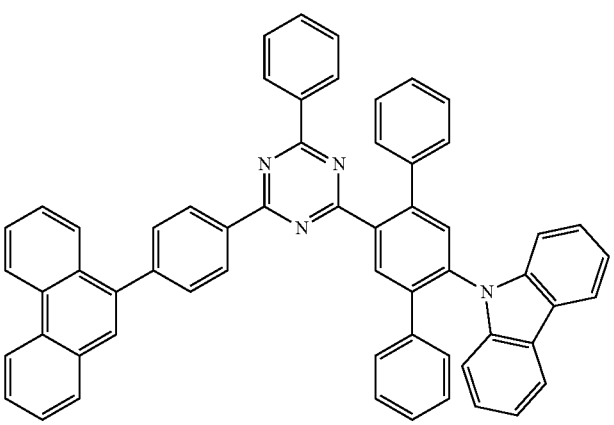 [SMILES: c1ccc(-c2nc(-c3ccc(-c4cc5ccccc5c5ccccc45)cc3)nc(-c3cc(-c4ccccc4)c(-n4c5ccccc5c5ccccc54)cc3-c3ccccc3)n2)cc1] |

TABLE 1-continued

| Formula | Ar1-X | Yield (%) | Desired compounds |
|---|---|---|---|
| 1-11 | | 69 | |
| 1-12 | | 64 | |

Preparation Example 2

1) Preparation of Compound 2-1

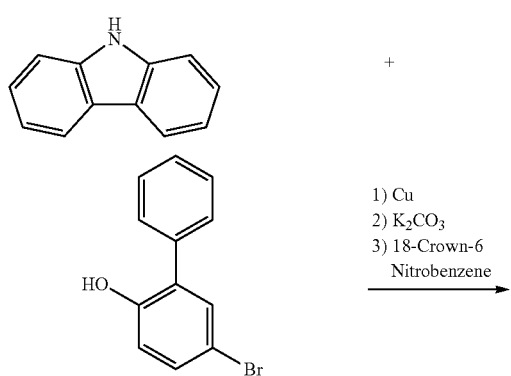

1) Cu
2) K$_2$CO$_3$
3) 18-Crown-6
Nitrobenzene

-continued

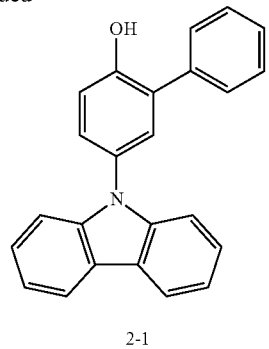

2-1

50 g (291.98 mmol, 1 eq) of 9H-carbazole, 109 g (437.98 mmol, 1.5 eq) of 5-bromo-[1,1'-biphenyl]-2-ol, 5.56 g (87.59 mmol, 0.2 q) of Cu, 120 g (875.96 mmol, 3 eq) of K$_2$CO$_3$, and 38.5 g (145.99 mmol, 0.5 eq) of 18-Crown-6 were added to a 2 L round flask, and then 970 mL of nitrobenzene was added thereto, followed by reflux stirring. After reaction, filtration was performed using a Celite hot filter, and distillation was performed. Then, purification was performed using a silica-gel column to obtain 49.5 g of Compound 2-1 in a yield of 50%.

2) Preparation of Compound 2-2

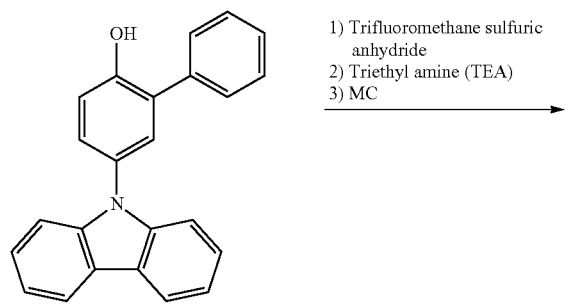
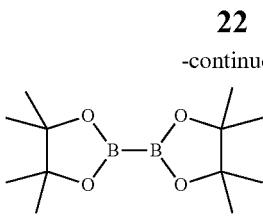

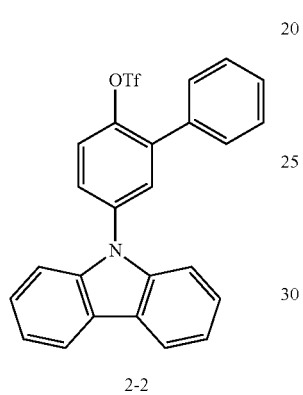

2-2

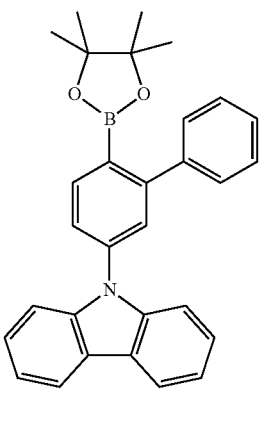

2-3

50 g (147.30 mmol, 1 eq) of 5-(4a,4b,8a,9a-tetrahydro-9H-carbazol-9-yl)-[1,1′-biphenyl]-2-ol, 29.8 g (294.60 mmol, 2 eq) of triethyl amine, and 730 mL of methylene chloride (MC) were added to a 2 L round flask and stirred at 0° C. Then, 49.87 g (176.76 mmol, 1.2 eq) of trifluoromethane sulfuric anhydride was added dropwise thereto, followed by stirring for 1 hour. After reaction, extraction was performed using CH$_2$Cl$_2$/H$_2$O, and a CH$_2$Cl$_2$ layer was dried using MgSO$_4$. Then, purification was performed using a silica-gel column to obtain 57 g of Compound 2-2 in a yield of 82%.

3) Preparation of Compound 2-3

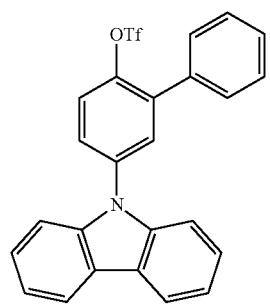

+

50 g (106.04 mmol, 1 eq) of 5-(4a,4b,8a,9a-tetrahydro-9H-carbazol-9-yl)-[1,1′-biphenyl]-2-yl trifluoromethanesulfonate, 53.87 g (212.09 mmol, 2 eq) of 4,4,4′,4′,5,5,5′,5′-octamethyl-2,2′-bi(1,3,2-dioxaborolane), 6.1 g (10.60 mmol, 0.1 eq) of Pd(dba)$_2$, 5.9 g (21.21 mmol, 0.2 eq) of Pcy3, 97.5 g (994.06 mmol, 4 eq) of potassium acetate, and 1.1 L of 1,4-dioxane were added to a 3 L round flask, followed by reflux stirring. After reaction, extraction was performed using CH$_2$Cl$_2$/H$_2$O, and a CH$_2$Cl$_2$ layer was dried using MgSO$_4$. Then, purification was performed using a silica-gel column to obtain 41 g of Compound 2-3 in a yield of 87%.

4) Preparation of Compound 2-4

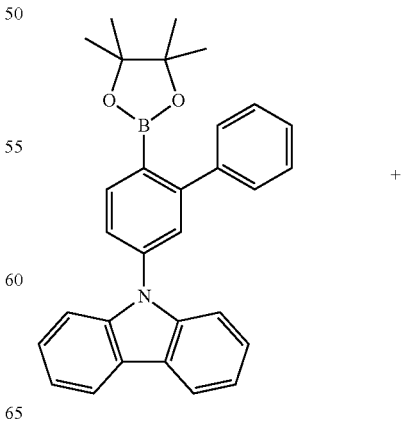

+

23

-continued

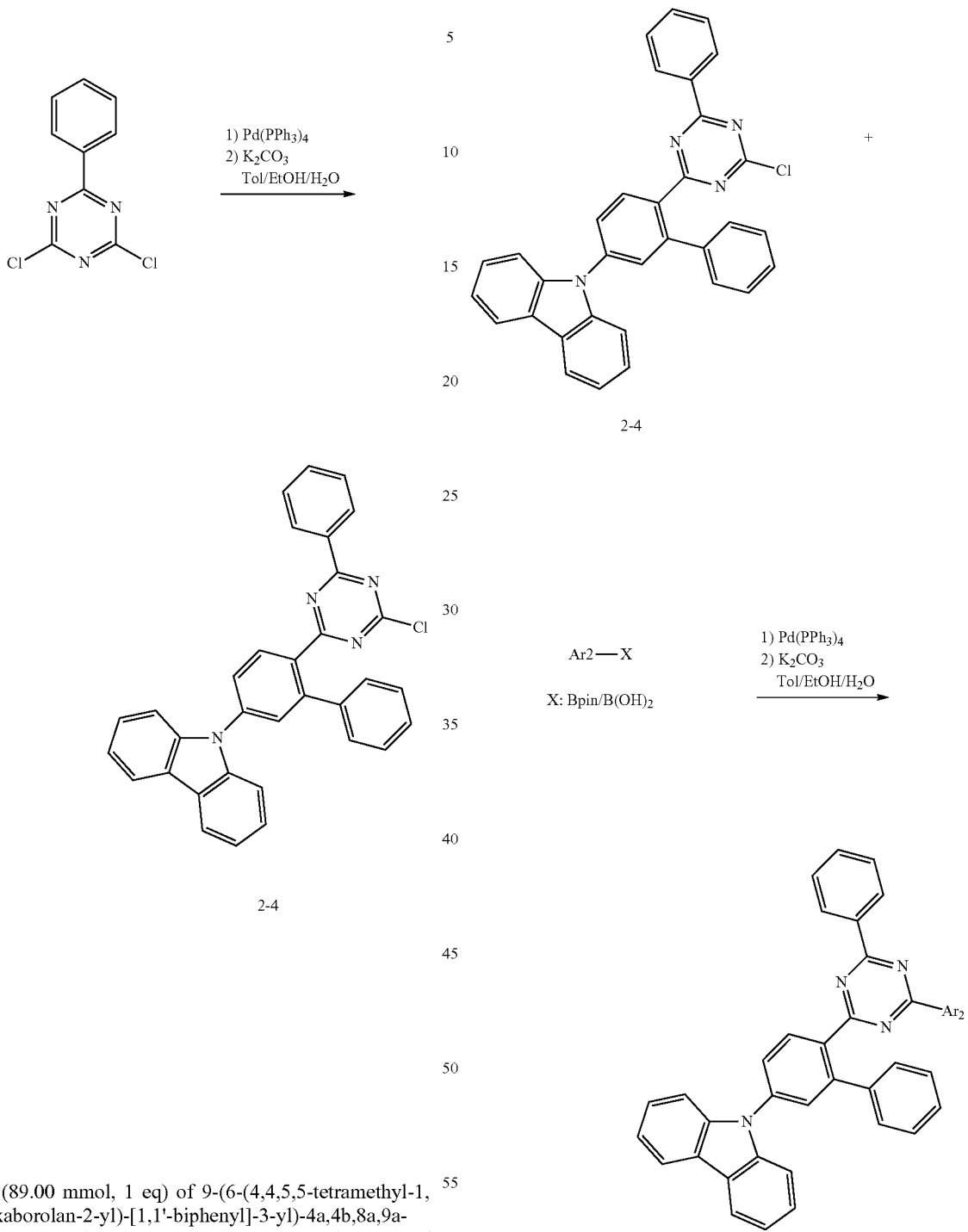

5) Preparation of Desired Compound 40 g (89.00 mmol, 1 eq) of 9-(6-(4,4,5,5-tetramethyl-1,3,2-dioxaborolan-2-yl)-[1,1'-biphenyl]-3-yl)-4a,4b,8a,9a-tetrahydro-9H-carbazole, 40.2 g (178.01 mmol, 2 eq) of 2,4-dichloro-6-phenyl-1,3,5-triazine, 51.4 g (4.45 mmol, 0.05 eq) of Pd(PPh$_3$)$_4$, and 36.8 g (267.02 mmol, 3 eq) of K$_2$CO$_3$ were added to a 2 L round flask, and then toluene, ethanol (Et-OH), and H$_2$O were added thereto in an amount of 445 mL, 90 mL, and 90 mL, respectively, followed by reflux stirring. After reaction, extraction was performed using CH$_2$Cl$_2$/H$_2$O, and a CH$_2$Cl$_2$ layer was dried using MgSO$_4$. Then, purification was performed using a silica-gel column to obtain 32.8 g of Compound 2-4 in a yield of 72%.

Compound 2-4 (1 eq), Ar2-X (1 eq) shown in Table 2 below, Pd (PPh$_3$)$_4$ (0.05 eq), and K$_2$CO$_3$ (3 eq) were added to a 500 mL round flask, and toluene, Et-OH, and H$_2$O were added thereto, followed by reflux stirring. After reaction, extraction was performed using CH$_2$Cl$_2$/H$_2$O, and a CH$_2$Cl$_2$ layer was dried using MgSO$_4$. Then, purification was performed using a silica-gel column to obtain a desired compound having structures shown in Table 2 below.

TABLE 2

| Formula | Ar2-X | Yield (%) | Desired compound |
|---|---|---|---|
| 1-6 | | 73 | |

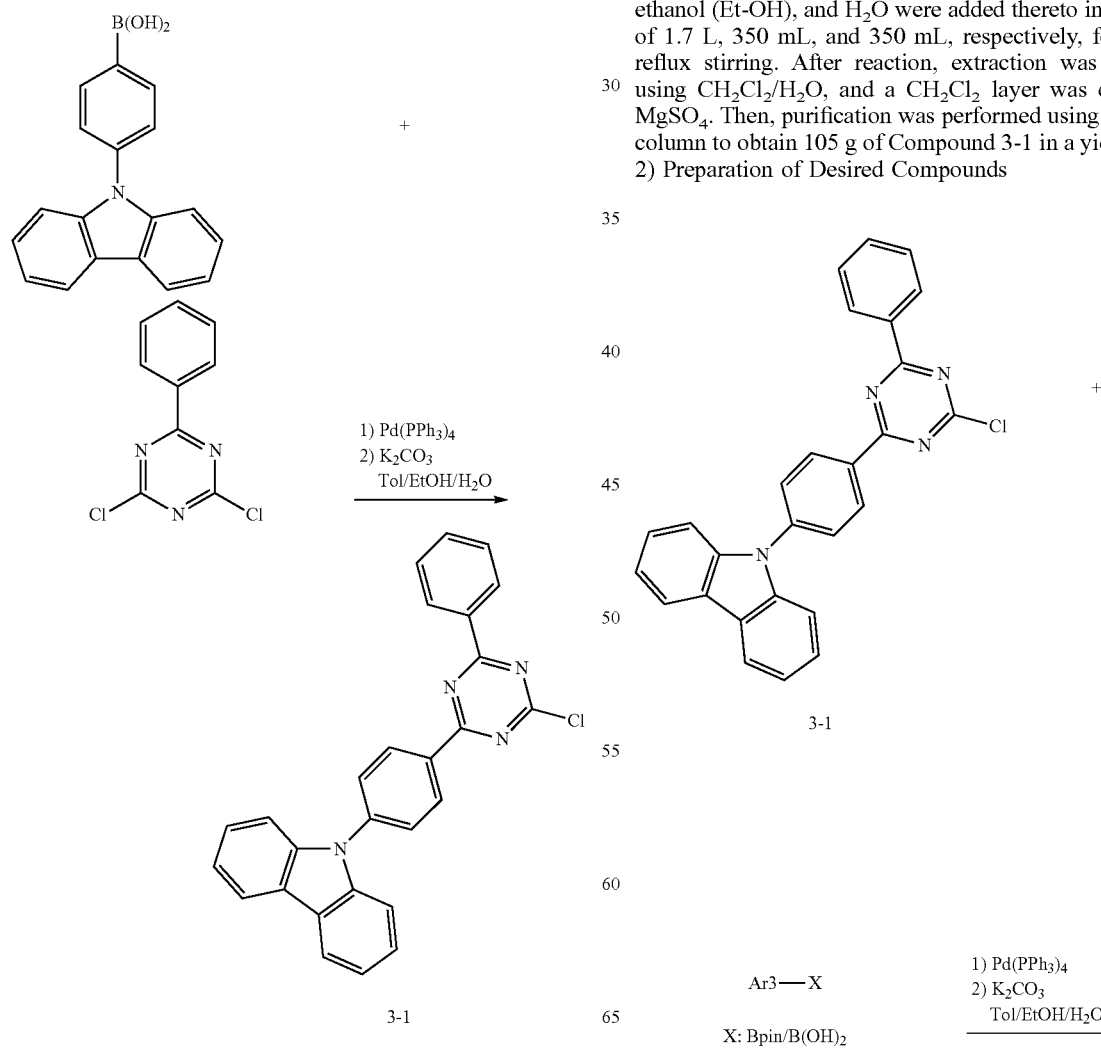

Preparation Example 3

1) Preparation of Compound 3-1

100 g (343.45 mmol, 1 eq) of (4-(4a,4b,8a,9a-tetrahydro-9H-carbazol-9-yl)phenyl)boronic acid, 155 g (686.90 mmol, 2 eq) of 2,4-dichloro-6-phenyl-1,3,5-triazine, 19.83 g (17.17 mmol, 0.05 eq) of Pd(PPh$_3$)$_4$, and 142 g (1,030.36 mmol, 3 eq) of K$_2$CO$_3$ were added to a 5 L round flask, and toluene, ethanol (Et-OH), and H$_2$O were added thereto in an amount of 1.7 L, 350 mL, and 350 mL, respectively, followed by reflux stirring. After reaction, extraction was performed using CH$_2$Cl$_2$/H$_2$O, and a CH$_2$Cl$_2$ layer was dried using MgSO$_4$. Then, purification was performed using a silica-gel column to obtain 105 g of Compound 3-1 in a yield of 70%.

2) Preparation of Desired Compounds

-continued

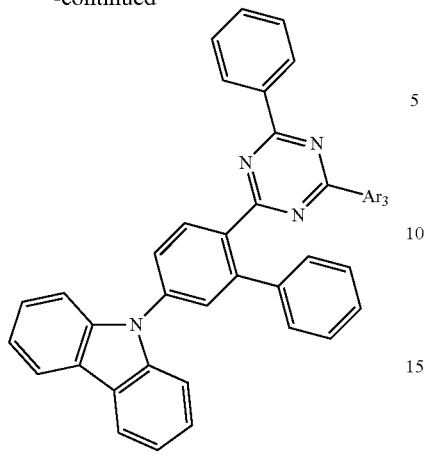

Compound 3-1 (1 eq), Ar3-X (1 eq) shown in Table 3 below, Pd (PPh$_3$)$_4$ (0.05 eq), and K$_2$CO$_3$ (3 eq) were added to a 500 mL round flask, and toluene, Et-OH, and H$_2$O were added thereto, followed by reflux stirring. After reaction, extraction was performed using CH$_2$Cl$_2$/H$_2$O, and a CH$_2$Cl$_2$ layer was dried using MgSO$_4$. Then, purification was performed using a silica-gel column to obtain desired compounds having structures shown in Table 3 below. The obtained desired compounds were confirmed by the results of NMR and FD-MS analysis shown in Tables 4 and 5.

TABLE 3

| Formula | Ar1-X | Yield (%) | Desired compounds |
|---|---|---|---|
| 1-4 | | 74 | |
| 1-5 | | 72 | |

TABLE 3-continued

| Formula | Ar1-X | Yield (%) | Desired compounds |
|---|---|---|---|
| 1-13 | | 68 | |

TABLE 4

| Formula | $^1$H NMR (CDCl$_3$), 300 MHz |
|---|---|
| 1-1 | 9.08 (1H, d), 8.84 (1H, d), 8.55 (1H, d), 8.36 (2H, d), 8.27 (1H, d), 8.19 (1H, d), 8.05 (1H, s), 7.96~7.90 (8H, m), 7.70~7.50 (9H, m), 7.35 (1H, t), 7.25~7.16 (4H, m) |
| 1-2 | 9.08 (1H, d), 8.84 (1H, d), 8.55 (1H, d), 8.40~8.27 (4H, d), 8.19 (1H, d), 8.10~7.90 (7H, m), 7.79~7.41 (15H, m), 7.25~7.16 (4H, m) |
| 1-3 | 9.08 (1H, d), 8.84 (1H, d), 8.55 (1H, d), 8.36 (2H, d), 8.27 (1H, d), 8.19 (1H, d), 8.08~7.90 (8H, m), 7.70~7.35 (11H, m), 7.25~7.16 (8H, m) |
| 1-4 | 9.08 (1H, d), 8.84 (1H, d), 8.55 (1H, d), 8.36 (2H, d), 8.27 (1H, d), 8.19~8.13 (3H, m), 8.05 (1H, d), 7.94~7.90 (6H, m), 7.79~7.35 (16H, m), 7.20~7.16 (2H, m) |
| 1-5 | 9.08 (1H, d), 8.84~8.79 (2H, d), 8.55 (1H, d), 8.36 (2H, d), 8.19~8.13 (3H, m), 8.06~8.05 (2H, d), 7.96~7.91 (6H, m), 7.79~7.35 (15H, m), 7.20~7.16 (2H, m) |
| 1-6 | 9.08 (1H, d), 8.84 (1H, d), 8.55 (1H, d), 8.40~8.36 (3H, m), 8.27 (1H, d), 8.19~8.02 (6H, m) 7.94~7.90 (2H, d), 7.70~7.35 (21H, m), 7.20~7.16 (2H, m) |
| 1-7 | 9.08 (1H, d), 8.84 (1H, d), 8.55 (1H, d), 8.36~8.27 (4H, m), 8.06~8.05 (2H, m), 7.96~7.90 (8H, m), 7.70~7.63 (4H, m), 7.50~7.35 (6H, m), 7.25~7.19 (7H, m) |
| 1-8 | 9.08 (1H, d), 8.84 (1H, d), 8.55 (1H, d), 8.35~8.13 (7H, m), 8.05 (1H, d), 7.94~7.90 (6H, m) 7.79~7.35 (16H, m), 7.20~7.16 (2H, m) |
| 1-9 | 9.09 (2H, d), 8.84 (1H, d), 8.55 (1H, d), 8.49 (1H, d), 8.30~8.16 (6H, m), 8.08~7.90 (9H, m), 7.70~7.50 (8H, m), 7.35 (1H, t), 7.25~7.16 (4H, m) |
| 1-10 | 9.08 (1H, d), 8.84 (1H, d), 8.59 (1H, s), 8.55 (1H, s), 8.36 (2H, d), 8.27 (2H, s), 8.19 (1H, d) 8.05 (1H, s), 7.96~7.90 (4H, m), 7.70~7.41 (16H, m), 7.25~7.16 (8H, m) |
| 1-11 | 9.08 (1H, d), 8.84 (1H, d), 8.55 (1H, d), 8.40~8.27 (5H, m), 8.06~7.90 (8H, m), 7.79~7.63 (6H, m), 7.50~7.35 (9H, m), 7.25~7.16 (7H, m) |
| 1-12 | 9.08 (1H, d), 8.84 (1H, d), 8.55 (1H, d), 8.36~8.27 (4H, m), 8.06~7.90 (9H, m), 7.70~7.63 (4H, m), 7.50~7.41 (7H, m), 7.25~7.16 (11H, m) |
| 1-13 | 9.08 (1H, d), 8.84 (1H, d), 8.79 (1H, d), 8.55 (1H, d), 8.36~8.32 (4H, m), 8.19 (1H, d), 8.05 (1H.s), 7.94~7.90 (6H, m), 7.70~7.35 (20H, m), 7.20~7.16 (2H, t) |

TABLE 5

| Compounds | FD-MS | Compounds | FD-MS | Compounds | FD-MS | Compounds | FD-MS |
|---|---|---|---|---|---|---|---|
| 1-1 | m/z = 650.25 C47H30N4 = 650.79 | 1-2 | m/z = 726.28 C53H34N4 = 726.88 | 1-7 | m/z = 726.28 C53H34N4 = 726.88 | 1-8 | m/z = 725.28 C54H35N3 = 725.90 |
| 1-3 | m/z = 726.28 C53H34N4 = 726.88 | 1-4 | m/z = 726.28 C53H34N4 = 726.88 | 1-9 | m/z = 699.27 C52H33N = 699.86 | 1-10 | m/z = 802.31 C59H38N = 802.98 |
| 1-5 | m/z = 726.28 C53H34N4 = 726.88 | 1-6 | m/z = 802.31 C59H38N = 802.98 | 1-11 | m/z = 802.31 C59H38N = 802.98 | 1-12 | m/z = 802.31 C59H38N = 802.98 |

TABLE 5-continued

| Compounds | FD-MS | Compounds | FD-MS |
|---|---|---|---|
| 1-13 | m/z = 802.31<br>C59H38N = 802.98 | | |

Example 1

A substrate used to fabricate a device was ultrasonically cleaned with distilled water for 10 minutes, dried in an oven set at 100° C. for 30 minutes, and then transferred to a vacuum deposition chamber.

In Example 1, a top emission substrate was used, and an anode was formed of a metal/ITO layer. Silver (Ag) was used as the metal, and the thickness of indium tin oxide (ITO) was 10 nm. On the ITO electrode, a hole injection layer, a hole transport layer, an electron blocking layer, an organic light-emitting layer, an electron transport layer, and an electron injection layer were sequentially deposited.

Specifically, the hole injection layer (HIL) was deposited to have a thickness of 5 nm. In addition, on the hole injection layer, the hole transport layer (HTL) was deposited to have a thickness of 120 nm. On the deposited hole transport layer, an electron blocking layer (EBL) was deposited to have a thickness of 15 nm. Then, to form the organic light-emitting layer, a BH compound was deposited to have a thickness of 20 nm, and 5% by weight of a BD compound was added as an impurity. In addition, Chemical Formula 1-1 prepared in Preparation Example 1 and lithium quinolate (LiQ) were mixed in a weight ratio of 2:1. Then, to form the electron transport layer (ETL), the mixture was deposited on the organic light-emitting layer to have a thickness of 30 nm. In addition, to form the electron injection layer (EIL), LiF was deposited to have a thickness of 1 nm.

In the process, the deposition rate of the organic material layer was maintained at 0.5 to 1.0 Å/sec. During deposition, degree of vacuum was maintained at 1 to $4 \times 10^{-7}$ torr.

In addition, to maximize a resonance effect, a translucent electrode (cathode) was disposed on the electron injection layer. In this case, a magnesium (Mg)-silver (Ag) alloy was used to form the translucent electrode, and the translucent electrode was formed to have a thickness of 14 nm.

Finally, to improve light efficiency, a capping layer (CPL) was deposited to have a thickness of 63 nm. In addition, after vacuum deposition, the substrate was transferred to a glove box, and an encapsulation process was performed. A glass cap having a moisture absorbent (getter) therein was used as a sealing member. In addition, compounds used in deposition of each layer are as follows.

[HIL]

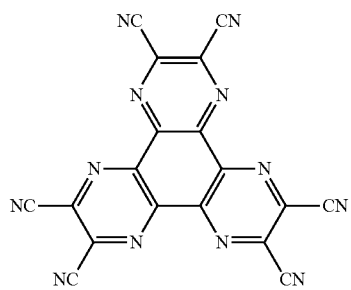

[HTL]

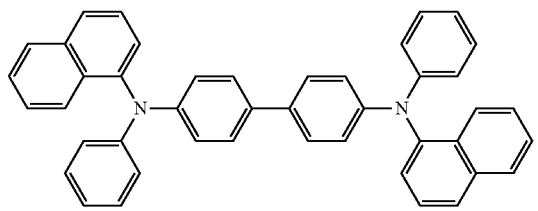

[EBL]

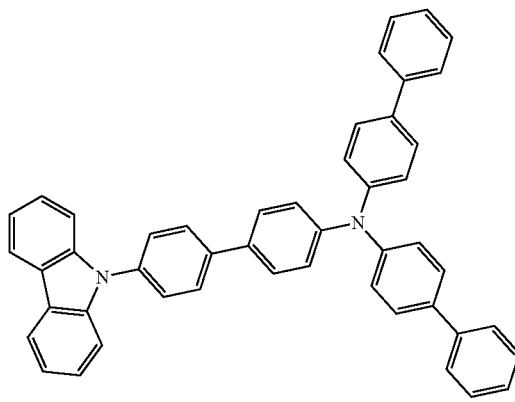

[BH]

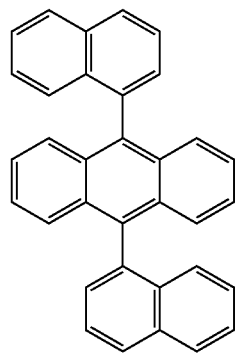

[BD]

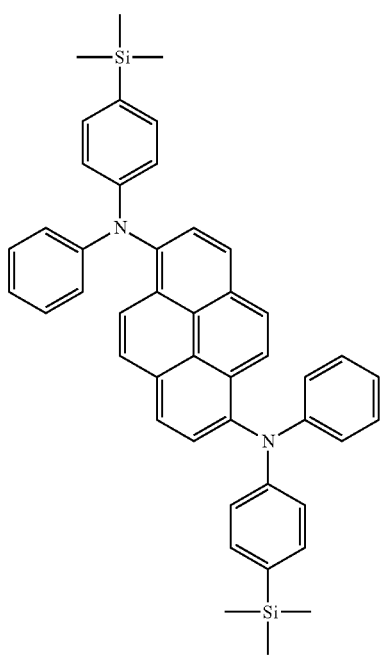

-continued

[LiQ]

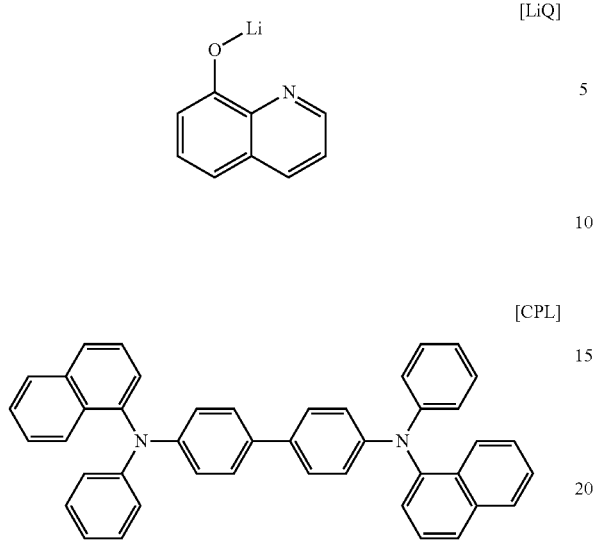

[CPL]

Examples 2 to 13

Experiments were conducted in the same manner as in Example 1, except that the compounds of Table 6 were used instead of Chemical Formula 1-1.

Comparative Example 1

An experiment was conducted in the same manner as in Example 1, except that ET1 represented by the following chemical formula was used instead of Chemical Formula 1-1.

<ET1> Chemical formula

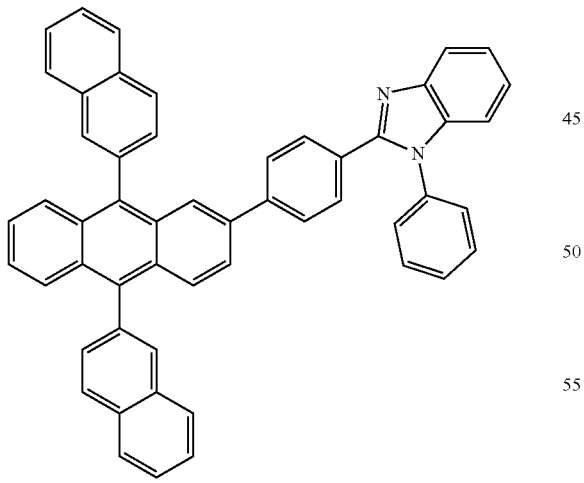

Comparative Example 2

An experiment was conducted in the same manner as in Example 1, except that ET2 represented by the following chemical formula was used instead of Chemical Formula 1-1.

<ET2> Chemical formula

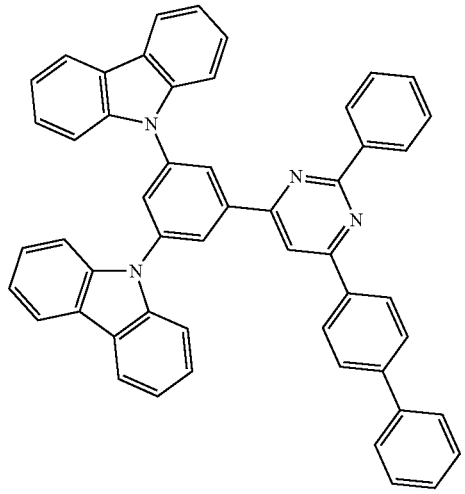

Comparative Example 3

An experiment was conducted in the same manner as in Example 1, except that ET3 represented by the following chemical formula was used instead of Chemical Formula 1-1.

<ET3> Chemical formula

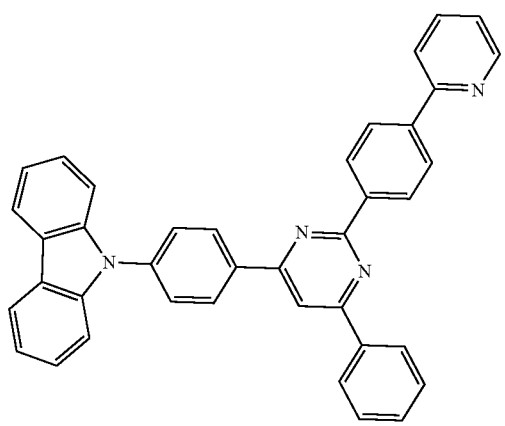

Comparative Example 4

An experiment was conducted in the same manner as in Example 1, except that ET4 represented by the following chemical formula was used instead of Chemical Formula 1-1.

<ET4> Chemical formula

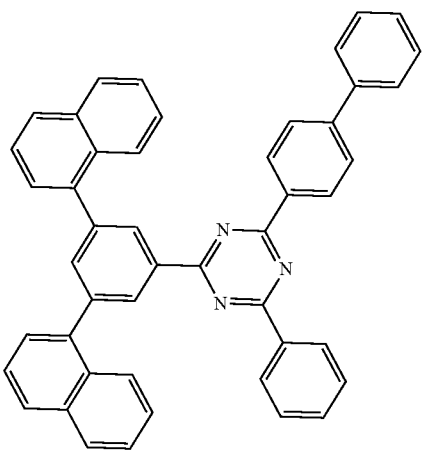

Comparative Example 5

An experiment was conducted in the same manner as in Example 1, except that ET5 represented by the following chemical formula was used instead of Chemical Formula 1-1.

<ET5> Chemical formula

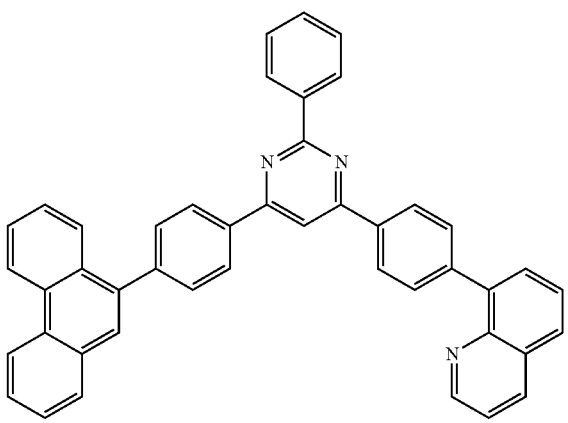

Experimental Example

The driving voltage and luminous efficacy of the organic light-emitting devices manufactured in examples and comparative examples were measured at a current density of 10 mA/cm². At this time, based on an initial luminance of 1,000 cd/m², time (LT95) for luminance to reach 95% was measured, and the results are shown in Table 6 below.

TABLE 6

| Classification | Chemical Formula | Voltage (V) | Current efficiency (cd/A) | LT95 at 1,000 cd/m² (time) |
| --- | --- | --- | --- | --- |
| Example 1 | 1-1 | 3.81 | 7.81 | 231 |
| Example 2 | 1-2 | 4.01 | 7.76 | 203 |
| Example 3 | 1-3 | 3.98 | 7.61 | 207 |
| Example 4 | 1-4 | 4.13 | 7.31 | 199 |

TABLE 6-continued

| Classification | Chemical Formula | Voltage (V) | Current efficiency (cd/A) | LT95 at 1,000 cd/m² (time) |
| --- | --- | --- | --- | --- |
| Example 5 | 1-5 | 4.11 | 7.33 | 183 |
| Example 6 | 1-6 | 4.17 | 7.09 | 189 |
| Example 7 | 1-7 | 3.89 | 7.80 | 229 |
| Example 8 | 1-8 | 4.11 | 8.03 | 181 |
| Example 9 | 1-9 | 4.23 | 7.98 | 173 |
| Example 10 | 1-10 | 4.31 | 7.56 | 193 |
| Example 11 | 1-11 | 3.99 | 7.43 | 191 |
| Example 12 | 1-12 | 3.93 | 7.31 | 189 |
| Example 13 | 1-13 | 4.03 | 7.18 | 183 |
| Comparative Example 1 | ET1 | 4.59 | 6.81 | 101 |
| Comparative Example 2 | ET2 | 4.09 | 7.75 | 183 |
| Comparative Example 3 | ET3 | 4.21 | 7.63 | 161 |
| Comparative Example 4 | ET4 | 4.07 | 7.59 | 185 |
| Comparative Example 5 | ET5 | 4.18 | 7.71 | 153 |

As shown in Table 6, it can be confirmed that, compared to Comparative Examples 1 to 5, the organic light-emitting diodes (Examples 1 to 13) including the organic compound of the present invention exhibit excellent driving voltage, luminous efficacy, and lifespan properties.

The invention claimed is:

1. An organic compound represented by Chemical Formula 1 below:

[Chemical Formula 1]

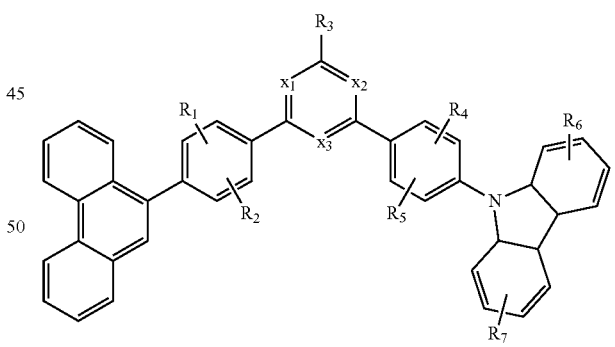

wherein $X_1$ to $X_3$ are independently nitrogen (N) or CH, at least two of $X_1$ to $X_3$ are nitrogen (N), $R_1$, $R_2$, $R_4$, $R_5$, R6, and $R_7$ are independently selected from the group consisting of hydrogen and unsubstituted phenyl, and $R_3$ is phenyl or naphthalenyl.

2. The organic compound according to claim 1, wherein, in Chemical Formula 1, $X_1$ to $X_3$ are all nitrogen (N).

3. The organic compound according to claim 1, wherein Chemical Formula 1 is one of Chemical Formulas 1-1 to 1-13:

[Chemical Formula 1-1]
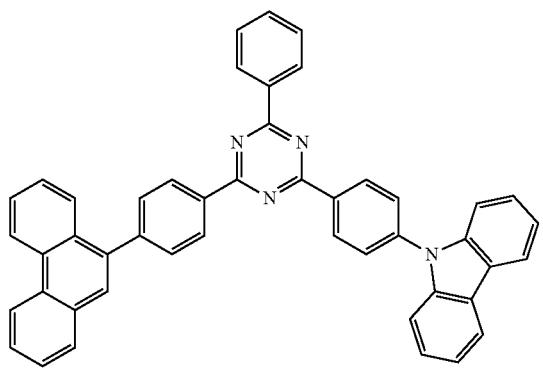
[Chemical Formula 1-2]
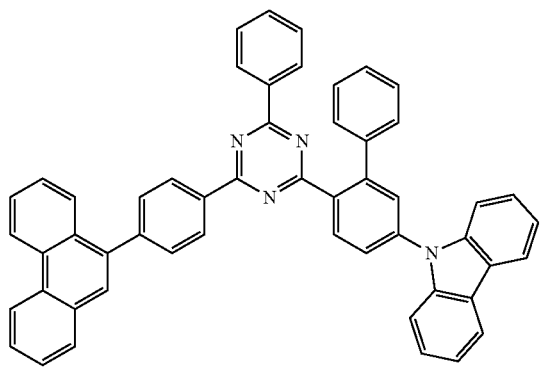
[Chemical Formula 1-3]
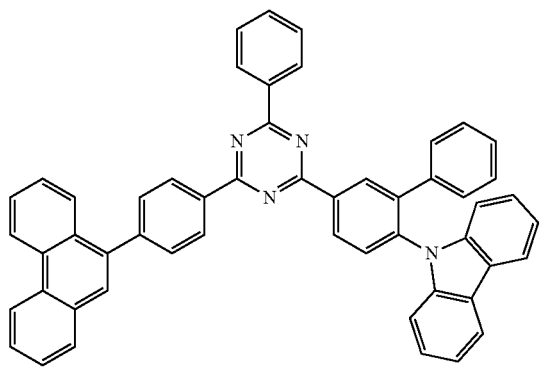
[Chemical Formula 1-4]
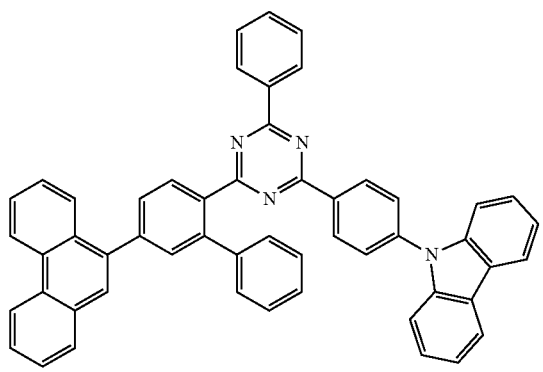
[Chemical Formula 1-5]
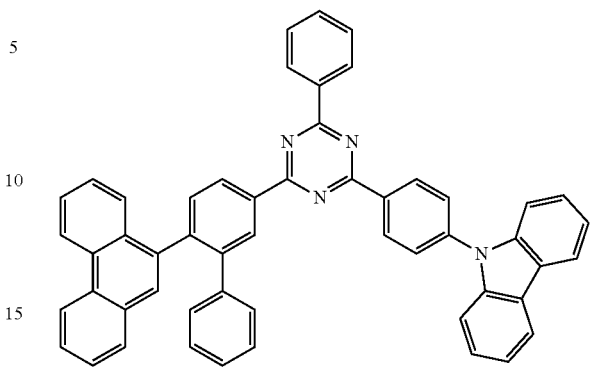
[Chemical Formula 1-6]
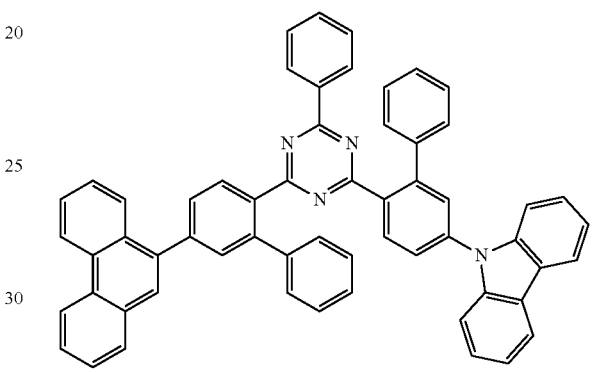
[Chemical Formula 1-7]
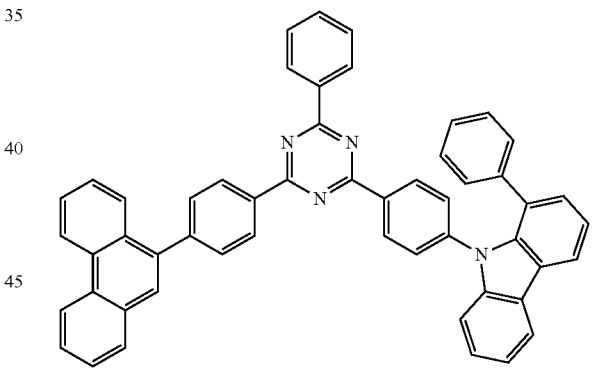
[Chemical Formula 1-8]
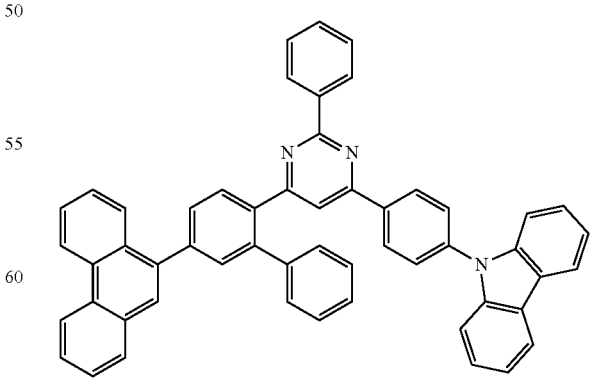

[Chemical Formula 1-9]

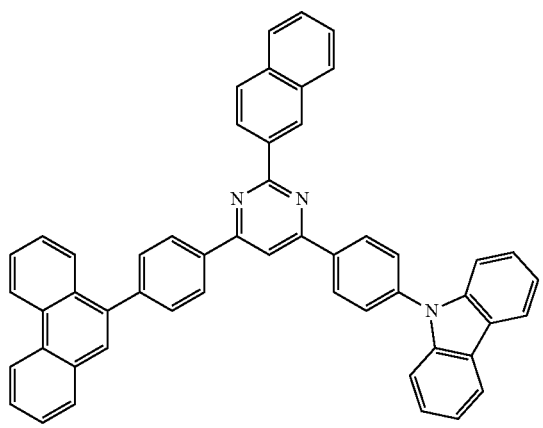

[Chemical Formula 1-10]

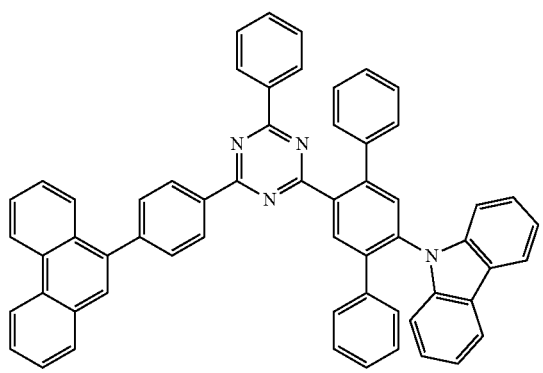

[Chemical Formula 1-11]

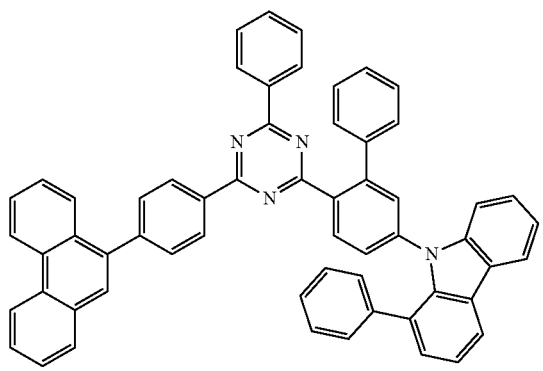 [SMILES: c1ccc(-c2nc(-c3ccc(-c4cc5ccccc5c5ccccc45)cc3)nc(-c3ccc(-n4c5ccccc5c5cccc(-c6ccccc6)c54)cc3-c3ccccc3)n2)cc1]

[Chemical Formula 1-12]

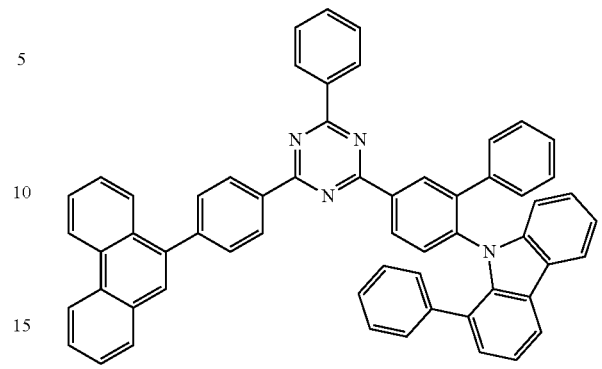

[Chemical Formula 1-13]

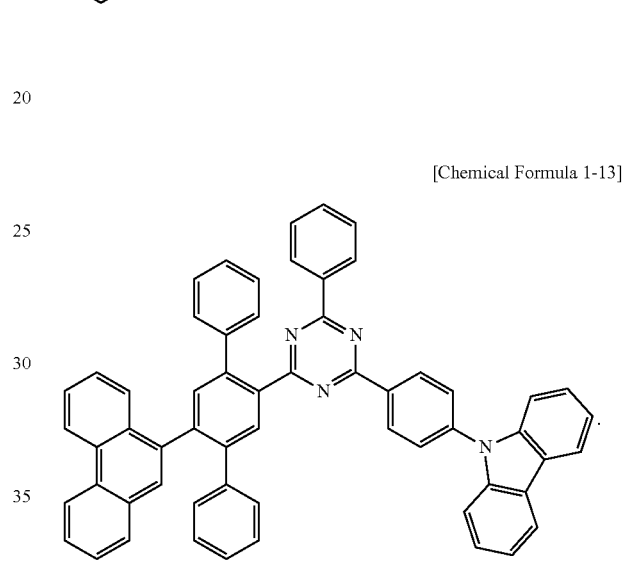

4. An electron transport material, comprising the organic compound according to claim 1.

5. An organic light-emitting diode, comprising the electron transport material according to claim 4.

6. The organic light-emitting diode according to claim 5, comprising a first electrode; a second electrode; and an organic material layer disposed between the first and second electrodes,
  wherein the organic material layer comprises the electron transport material.

7. A display device, comprising the organic light-emitting diode according to claim 4.

* * * * *